US012769898B2

(12) United States Patent
Doll

(10) Patent No.: US 12,769,898 B2
(45) Date of Patent: Oct. 20, 2026

(54) SEARCH CAPABILITY FOR LIGHTWEIGHT VIEWER

(71) Applicant: RTX CORPORATION, Farmington, CT (US)

(72) Inventor: Stephen Doll, Ponte Vedra, FL (US)

(73) Assignee: RTX CORPORATION, Farmington, CT (US)

(*) Notice: Subject to any disclaimer, the term of this patent is extended or adjusted under 35 U.S.C. 154(b) by 330 days.

(21) Appl. No.: 18/467,816

(22) Filed: Sep. 15, 2023

(65) Prior Publication Data

US 2025/0094653 A1 Mar. 20, 2025

(51) Int. Cl.

| | |
|---|---|
| ***G06T 17/20*** | (2006.01) |
| ***G06F 3/0482*** | (2013.01) |
| ***G06F 30/12*** | (2020.01) |
| ***G06T 11/60*** | (2006.01) |

(52) U.S. Cl.

CPC ............ *G06F 30/12* (2020.01); *G06F 3/0482* (2013.01); *G06T 11/60* (2013.01); *G06T 17/20* (2013.01)

(58) Field of Classification Search

CPC .... G06F 3/048-05; G06F 30/12; G06T 17/20

See application file for complete search history.

(56) References Cited

U.S. PATENT DOCUMENTS

| | | | | |
|---|---|---|---|---|
| 7,613,539 | B2 | 11/2009 | Bae et al. | |
| 7,688,318 | B2 | 3/2010 | O'Malley et al. | |
| 8,274,506 | B1 * | 9/2012 | Rees | G06T 15/04 345/419 |
| 8,400,446 | B2 | 3/2013 | Gatzke et al. | |
| 8,922,576 | B2 | 12/2014 | Hickman et al. | |
| 9,152,435 | B2 | 10/2015 | Williamson | |
| 9,305,390 | B2 | 4/2016 | Schlichte et al. | |

(Continued)

FOREIGN PATENT DOCUMENTS

| | | |
|---|---|---|
| CN | 115099431 | 9/2022 |
| KR | 20220100285 | 7/2022 |

OTHER PUBLICATIONS

Merriam-Webster.com, "of 1 of 3 preposition", retrieved Oct. 6, 2025 (Year: 2025).*

(Continued)

*Primary Examiner* — Daniel Rodriguez

(74) *Attorney, Agent, or Firm* — Carlson, Gaskey & Olds, P.C.

(57) ABSTRACT

A user interface for a lightweight viewer may include, among other things, a viewing window operable to display geometry established by one or more of geometric objects of a tessellated model. One or more annotation objects of the tessellated model are assigned information associated with the respective one or more geometric objects and are operable to depict the respective information as a graphical annotation in the viewing window. A search window is established by a plurality of content objects of the tessellated model. The content objects include a query object and a results object dynamically linked to the query object. The query object establishes a query input field operable to query the information of the one or more annotation objects. The results object is operable to display a list of results meeting the query. A method of establishing a tessellated model is also disclosed.

21 Claims, 10 Drawing Sheets

(56) References Cited

U.S. PATENT DOCUMENTS

| | | | | |
|---|---|---|---|---|
| 9,761,045 | B1 | 9/2017 | Cote et al. | |
| 9,870,436 | B2 | 1/2018 | Lorono et al. | |
| 9,886,530 | B2 | 2/2018 | Mehr et al. | |
| 10,031,640 | B2 | 7/2018 | Hilton et al. | |
| 10,121,286 | B2 | 11/2018 | Alsaffar et al. | |
| 10,872,465 | B2 | 12/2020 | Cochrane et al. | |
| 11,308,245 | B2 | 4/2022 | Yang et al. | |
| 11,429,756 | B2 | 8/2022 | Birkett-Smith et al. | |
| 11,810,659 | B2 | 11/2023 | Imasugi et al. | |
| 11,893,312 | B2 | 2/2024 | Baran et al. | |
| 2005/0203876 | A1* | 9/2005 | Cragun | G06F 16/10 |
| 2008/0075095 | A1* | 3/2008 | Suryanarayana | H04L 65/1104 370/352 |
| 2010/0031135 | A1* | 2/2010 | Naghshin | G06Q 10/10 715/230 |
| 2010/0045662 | A1* | 2/2010 | Boothroyd | G06F 16/972 345/522 |
| 2013/0249906 | A1* | 9/2013 | Gunderson | G06T 15/20 345/420 |
| 2014/0059419 | A1* | 2/2014 | Devries | G06F 16/951 715/233 |
| 2015/0033109 | A1* | 1/2015 | Marek | G06F 16/438 715/230 |
| 2015/0325043 | A1* | 11/2015 | Bromley | G06T 17/00 345/424 |
| 2016/0171124 | A1* | 6/2016 | Briggs | G06F 30/00 703/1 |
| 2017/0212903 | A1* | 7/2017 | Bains | G06F 16/14 |
| 2020/0005361 | A1* | 1/2020 | Zeiger | G06T 15/503 |
| 2022/0198077 | A1 | 6/2022 | Mora et al. | |
| 2025/0061671 | A1* | 2/2025 | Jahn | G06F 3/04842 |
| 2025/0104867 | A1* | 3/2025 | Momoki | G16H 50/20 |

OTHER PUBLICATIONS

Jim Merry, "Making comments on 3D objects Acrobat 9 Pro Extended", published May 7, 2009, available at <<https://acrobatusers.com/tutorials/making-comments-3d-objects-acrobat-9/>>, 9 pages (Year: 2009).*

European Search Report for European Patent Application No. 24200387.9 mailed Feb. 13, 2025.

Merry, J. (2009). Making comments on 3D objects in Acrobat 9 Pro Extended: Learn how the 3D commenting tool in Acrobat 9 works. May 7, 2009. Retrieved from: https://acrobatusers.com/tutorials/making-comments-3d-objects-acrobat-9/.

YouTube. (2016). "SimLab Composer/Measuring mechanical systems." Retrieved from: https://www.youtube.com/watch?v=FYsohCnLwSs&t=546s.

YouTube. (2020). "Search and show objects in Creo Model Tree | Creo Tutorial." Retrieve from: https://www.youtube.com/watch?v=mTtOhgJREn4.

* cited by examiner

SEARCH CAPABILITY FOR LIGHTWEIGHT VIEWER

BACKGROUND

This disclosure relates to modeling and interaction with the design of various components.

Computer-Aided Design (CAD) systems are known and may be utilized to generate two-dimensional and three-dimensional (3D) models of various components. The associated CAD files may be relatively large, which may impede transfer to other computing systems. A lightweight, tessellated representation of the CAD model may be generated and stored within a file that excludes the original CAD model. The file may be saved in a Portable Document Format (PDF) or another file format. A lightweight viewer may be utilized to view the lightweight representation.

SUMMARY

A user interface for a lightweight viewer according to an example of the present disclosure includes a viewing window operable to display geometry established by one or more of geometric objects of a tessellated model. One or more annotation objects of the tessellated model are assigned information associated with the respective one or more geometric objects. The one or more annotation objects are operable to depict the respective information as a graphical annotation in the viewing window. A search window is established by a plurality of content objects of the tessellated model. The content objects include a query object and a results object dynamically linked to the query object. The query object establishes a query input field operable to query the information of the one or more annotation objects based on input in the query input field. The results object is operable to display a list of results meeting the query.

In a further embodiment of any of the foregoing embodiments, selection of a result from the list causes a depiction of the geometry to change in the viewing window.

A further embodiment of any of the foregoing embodiments includes a navigation window operable to display one or more view objects. The one or more view objects are associated with a respective depiction of the one or more geometric objects. The list of results includes the one or more view objects meeting the query. The viewing window is operable to display the depiction in response to selection of the associated result.

In a further embodiment of any of the foregoing embodiments, the one or more annotation objects include a plurality of annotation objects associated with one or more of the view objects.

In a further embodiment of any of the foregoing embodiments, the annotation objects include a first annotation object and a second annotation object associated with one or more different view objects.

In a further embodiment of any of the foregoing embodiments, the one or more annotation objects are associated with a set of annotation types. The content objects include one or more category search objects each associated with one or more of the annotation types. The category search objects are operable to limit the query to the respective one or more annotation types in response to user interaction.

In a further embodiment of any of the foregoing embodiments, the annotation types include an identifier annotation type and a datum annotation type.

In a further embodiment of any of the foregoing embodiments, the results object is associated with a counter object. The counter object is operable to indicate a quantity of results in the list.

In a further embodiment of any of the foregoing embodiments, the search window is spaced apart from, but concurrently displayed with, the viewing window.

In a further embodiment of any of the foregoing embodiments, the tessellated model excludes any CAD model associated with the geometry.

A system for generating a tessellated model according to an example of the present disclosure includes a computing device that has one or more processors coupled to memory. The computing device is operable to execute a modeling environment. The modeling environment is operable to access a computer-aided design (CAD) model associated with geometry, generate one or more geometric objects that establish a tessellation of the geometry, generate one or more annotation objects assigned information associated with the respective one or more geometric objects, and generate a plurality of content objects generate a tessellated model that has the one or more geometric objects, the one or more annotation objects and the content objects. The one or more geometric objects are operable to display the tessellation of the geometry in a viewing window of a user interface. The one or more annotation objects are operable to depict the respective information as a graphical annotation in the viewing window. The content objects are operable to establish a search window of the user interface. The content objects include a query object and a results object dynamically linked to the query object. The query object is operable to query the information of the one or more annotation objects in response to user input. The results object is operable to display a list of results meeting the query.

In a further embodiment of any of the foregoing embodiments, the search window is spaced apart from, but concurrently displayed with, the viewing window.

In a further embodiment of any of the foregoing embodiments, the one or more annotation objects are associated with a set of annotation types. The content objects include one or more category search objects each associated with one or more of the annotation types. The category search objects are operable to limit the query to the respective one or more annotation types in response to user interaction.

In a further embodiment of any of the foregoing embodiments, selection of a result from the list causes a depiction of the geometry to change in the viewing window.

In a further embodiment of any of the foregoing embodiments, the modeling environment is operable to store the tessellated model in a file readable by a lightweight viewer. The file excludes the CAD model.

In a further embodiment of any of the foregoing embodiments, the modeling environment is operable to store code in the file that is operable to cause one or more functions associated with the tessellated model to execute in the lightweight viewer.

A method of establishing a tessellated model according to an example of the present disclosure includes generating one or more geometric objects that establish a tessellation of geometry stored in a computer-aided design (CAD) model. The one or more geometric objects are operable to display the tessellation of the geometry in a viewing window of a user interface. The method includes generating one or more annotation objects. The method includes assigning information associated with the respective one or more geometric objects to the one or more annotation objects. The one or more annotation objects are operable to depict the respective information as a graphical annotation in the viewing window. The includes generating a plurality of content objects. The content objects are operable to establish a search window of the user interface. The content objects include a query object and a results object dynamically linked to the query object. The query object is operable to query the information of the one or more annotation objects in response to user input. The results object is operable to display a list of results meeting the query. The method includes generating a tessellated model including the one or more geometric objects, the one or more annotation objects and the content objects.

In a further embodiment of any of the foregoing embodiments, the results object is operable to causes a depiction of the geometry to change in the viewing window in response to selection of a result from the list.

A further embodiment of any of the foregoing embodiments includes assigning the one or more annotation objects to one or more annotation types. The content objects include one or more category search objects operable to limit the query based on annotation type in response to user interaction.

A further embodiment of any of the foregoing embodiments includes storing the tessellated model in a file that excludes the CAD model.

A further embodiment of any of the foregoing embodiments includes displaying the tessellated model in a lightweight viewer.

The present disclosure may include any one or more of the individual features disclosed above and/or below alone or in any combination thereof.

The various features and advantages of this disclosure will become apparent to those skilled in the art from the following detailed description. The drawings that accompany the detailed description can be briefly described as follows.

BRIEF DESCRIPTION OF THE DRAWINGS

Like reference numbers and designations in the various drawings indicate like elements.

DETAILED DESCRIPTION

Display space in a model-based definition (MBD) lightweight viewer used to render a tessellated model may be limited. The geometric model may be associated with many requirements which may need to be presented to the user in a user interface. Showing all the information simultaneously may exceed the amount of display space that may be available in the user interface.

Two-dimensional (2D) drawings may contain charts to identify location of symbols used in the definition. MBD utilizing a 3D lightweight viewer may lack the capability and area to easily incorporate a similar chart, making it difficult for the user to find the location of symbols or other text referenced in the definition. In addition, searching objects within the 3D model itself may not be available utilizing functionality provided by the lightweight viewer itself.

Disclosed are techniques for searching the 2D and/or three-dimensional (3D) definition of the tessellated model based on input parameters. Search functionality embedded in a display window of the lightweight viewer may present information relating to the associated design geometry. The search functionality may be operable to search objects within the 2D and/or 3D graphical views of the design geometry.

Data defined in the tessellated model may be searched and presented in a list (e.g., table) to the user that may display all instances in which the searched information was found. The list may be interactive such that a user can select an entry in the list and the viewing area may change to display a view or depiction of the geometry containing the searched object. The search query may be limited to quickly locate all instances of specific type(s) of annotations such as symbols or specifications. The search function may search the 3D data structure or a data object mapped from it. The search results can be dynamically linked to the object results. Application programming interface (API) functions may be used to create a search window (e.g., interface) and associated functionality. The API may not include a search window, but it may support field objects configurable to look like a search window in the user interface. The code (e.g., script) to generate the search window may be embedded within the same tessellated file associated with the tessellated geometry. The tessellated file may be stored in a lightweight format, such as a Portable Document File (PDF) format. Accordingly, the lightweight viewer does not have to be programmed to support the search window and any lightweight viewer that supports the file format may access the model and search functionality. The user may select the search result to display the associated model view in the user interface.

Figure 1:
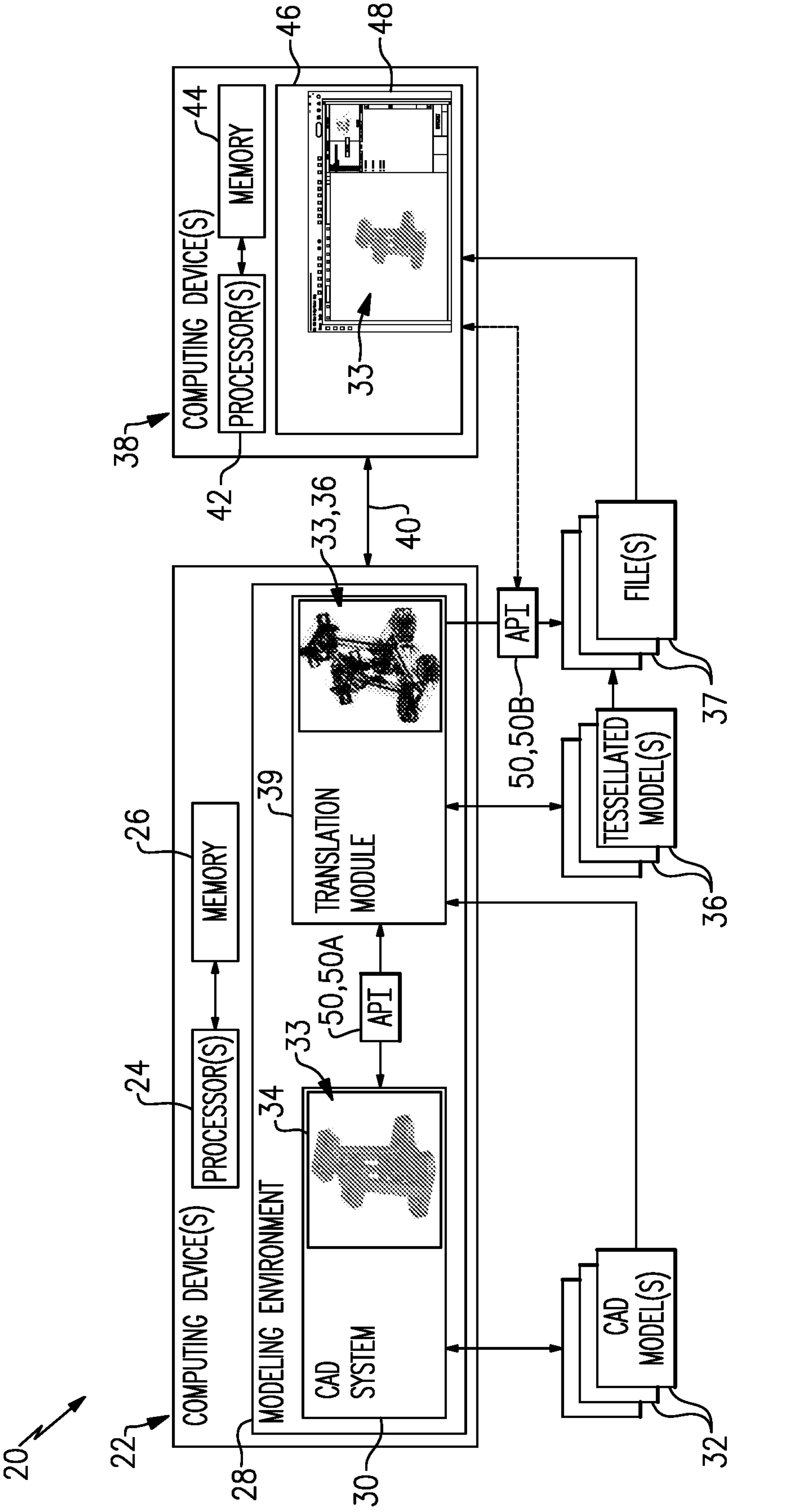
FIG. 1 discloses a modeling system.

FIG. 1 discloses a modeling system 20. The modeling system 20 may be operable to interact with one or more computer-aided design (CAD) models. The modeling system 20 may be operable to generate one or more tessellated models from the CAD model(s). The tessellated model may be relatively compact and may include a lesser amount of data compared to the CAD model. The tessellated model may represent CAD geometry as a set of facets (e.g., triangles) that may be patched together (sec, e.g., FIG. 2). Each of the facets may be defined by three respective points of a point cloud. The features disclosed herein may be incorporated into, or may otherwise be utilized with, a lightweight viewer. The tessellated models may be viewable in the lightweight viewer. For the purposes of this disclosure, a "lightweight viewer" is a software application suitable to view tessellated models. The lightweight viewer may be operable to view and interact with, but not edit, the tessellated model. Lightweight viewers may include a 3D PDF or HTML viewer or another viewer such as JT2Go operable to access tessellated models stored in a lightweight file format.

The modeling system 20 may include at least one computing device 22. The computing device 22 may include one or more processors 24 coupled to memory 26. The computing device 22 may be operable to execute a modeling environment (e.g., tool) 28. The modeling environment 28 may incorporate or may otherwise interface with a CAD system 30 (e.g., CATIA, AutoCAD, Solidworks, Siemens NX, etc.). The CAD system 30 and/or another portion of the modeling environment 28 may be operable to access one or more CAD models 32. Each of the CAD models 32 may be associated with geometry. The geometry may be associated with one or more virtual and/or physical components, assemblies and/or systems. The CAD system 30 may be operable to display one or more of the CAD models 32 in a user interface 34.

A user may desire to share or otherwise communicate information associated with the design to one or more other users, such as another member of a development team, a customer, or a supplier. The modeling environment 28 may be operable to generate one or more tessellated models 36, which may have a relatively lesser amount of information than the associated CAD model(s) 32 for communication to the other users. The tessellated model 36 may be stored in one or more lightweight files 37. The CAD model 32 and tessellated model 36 may be associated with geometry 33 (e.g., FIGS. 2 and 4A). The tessellated model 36 may exclude the exact CAD geometry and/or any CAD model 32 associated with the geometry 33.

Figure 2:
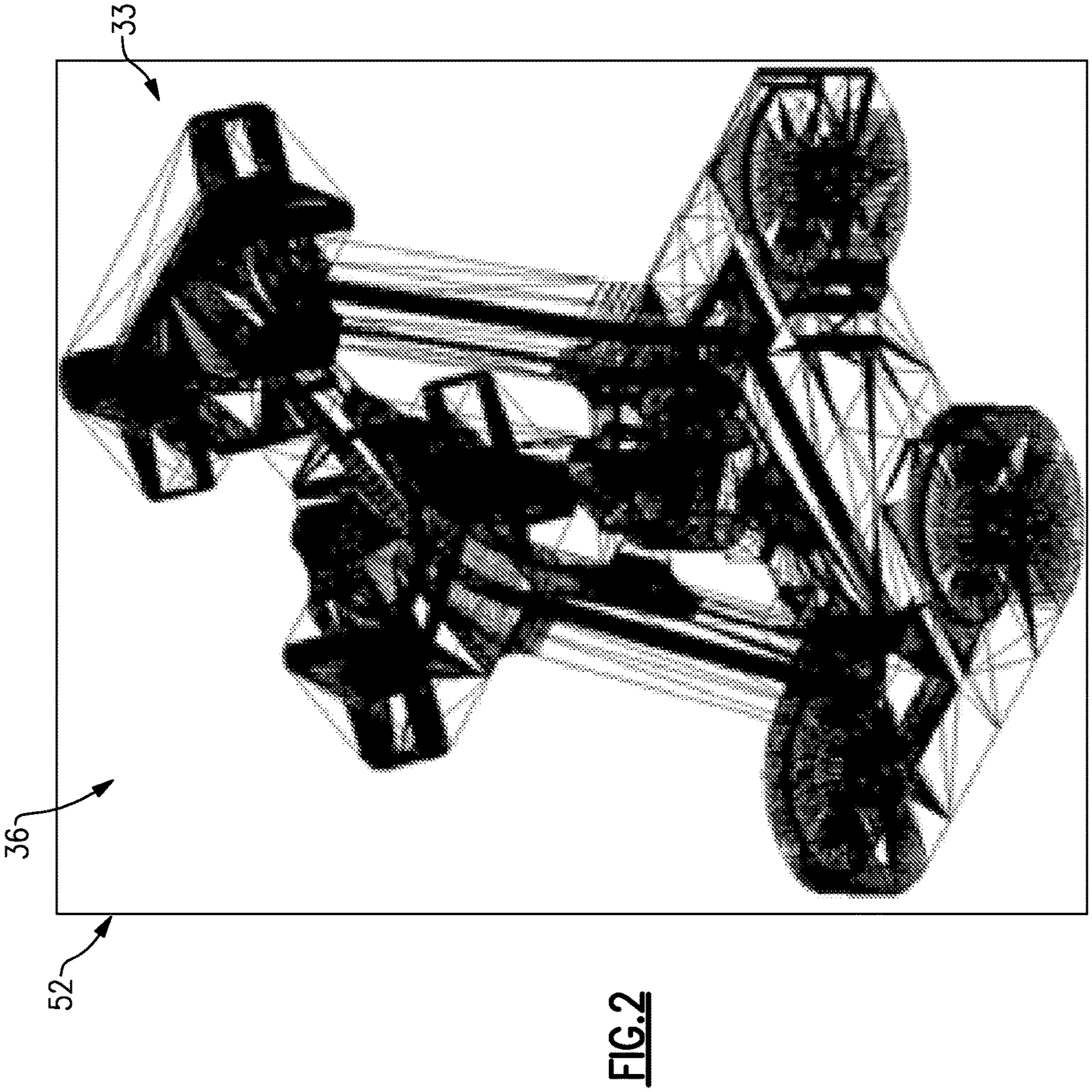
FIG. 2 discloses a graphical depiction of a tessellated model.

Various users may access and review the tessellated models 36 in a lightweight viewer. Various lightweight viewers may be utilized, such as Adobe which may be operable to access PDF files. The lightweight viewer may be operable to access and view lightweight files containing tessellated models but not any files containing CAD models, including the exact CAD geometry. In other implementations, the modeling environment 28 may be operable to store the tessellated model 36 and the exact CAD geometry in the same file. Each of the tessellated models 36 may be associated with one or more respective CAD models 32 that store the exact CAD geometry and related information. FIG. 2 discloses a graphical depiction of a tessellated model 36 according to an implementation. The specific geometry of the depicted tessellated model 36 is not intended to limit this disclosure.

The modeling environment 28 may be operable to access and display each of the tessellated models 36. In implementations, one or more (e.g., client) computing devices 38 may be operable to access the tessellated models 36. The computing devices 22, 38 may include one or more computer processors, memory, storage means, network devices, input and/or output devices, and/or interfaces. The computing devices 22, 38 may be operable to execute one or more software programs, including one or more portions of the modeling environment 28. The computing devices 22, 38 may be operable to communicate with one or more networks established by one or more computing devices. The memory may include UVPROM, EEPROM, FLASH, RAM, ROM, DVD, CD, a hard drive, or other computer readable medium which may store data and/or the functionality of this description. The computing devices 22, 38 may be a desktop computer, laptop computer, smart phone, tablet, or any other computer device. Input devices may include a keyboard, mouse, touchscreen, etc. The output devices may include a monitor, speakers, printers, etc. Each of the computing devices 38 may include one or more processors 42 coupled to memory 44. The computing device 38 may be coupled to the computing device 22 by connection(s) 40. The connection 40 may be a wired and/or wireless connection. The connection 40 may be established over one or more networks and/or other computing systems.

The processor 42 of the computing device 38 may be operable to execute a lightweight viewer 46. The lightweight viewer 46 may be a separate software application executable by the computing device 38 or may be a service provided by the computing device 22 which may be accessible by a thin client or browser over a network connection. The lightweight viewer 46 may be operable to access the tessellated models 36. The lightweight viewer 46 may be displayed in a display device. The lightweight viewer 46 may include a graphical user interface (GUI) 48 operable to display the tessellated model 36. The lightweight viewer 46 may be operable to read tessellated models 36 but not any CAD models 32, including CAD models 32 relating to geometry associated with the tessellated models 36.

Various techniques may be utilized to establish the tessellated models 36. The modeling environment 28 may be operable to generate one or more objects (e.g., elements), including any of the objects disclosed herein. In implementations, the objects may be field objects. The tessellated model 36 may include one or more field objects. The field objects and associated contents may be embedded within the tessellated model 36. The modeling environment 28 may include, or may otherwise interface with, one or more application programming interfaces (API) 50. In the implementation of FIG. 1, the system 20 may include or otherwise interface with a first API 50A and a second API 50B. The functionality of the APIs 50A, 50B may be incorporated into a single API 50 or may be distributed between three or more APIs 50. The CAD system 30 and/or lightweight viewer 46 may be operable to interact with the respective CAD models 32 and tessellated models 36 according to the API 50. The lightweight viewer 46 may be configured to recognize objects, function calls, data structures, etc. specified in the API(s) 50. The API 50 may be utilized to establish one or more tessellated models 36. The API 50 may be utilized to convert the CAD models 32 to tessellated models 36. The modeling environment 28 may include a translation module 39 operable to establish tessellated models 36 and/or lightweight files 37. The translation module 39 may be operable to interact with the API 50B to establish (e.g., render) tessellated models 36. The translation module 39 may be operable to interact with the API 50B to establish lightweight files 37 including tessellated model(s) 36 in a format (e.g., data structure) supported by the API 50B and/or lightweight viewer 46. The API 50 may be utilized to assign various information, scripts and other data to one or more fields of the field objects. The field objects may be established according to data structure(s) specified in the API 50. The API 50 may provide the ability to associate scripts with objects of the tessellated model 36. The code (e.g., script) to generate the disclosed features and/or any code that causes any associated functions to occur in the lightweight viewer (e.g., in response to selection of the objects of the model 36) may be embedded within the same lightweight file 37 as the objects of the model 36 associated with the model geometry 33. The scripts and other code may be executed in response to user interaction and/or selection of the respective field object. The script may be specified according to JavaScript or another scripting language supported by the API 50. Storing the code that causes the function(s) associated with the objects and other features in the lightweight file 37 itself allows for the publisher to control the file presentation directly and does not require a special viewer.

Figure 3:
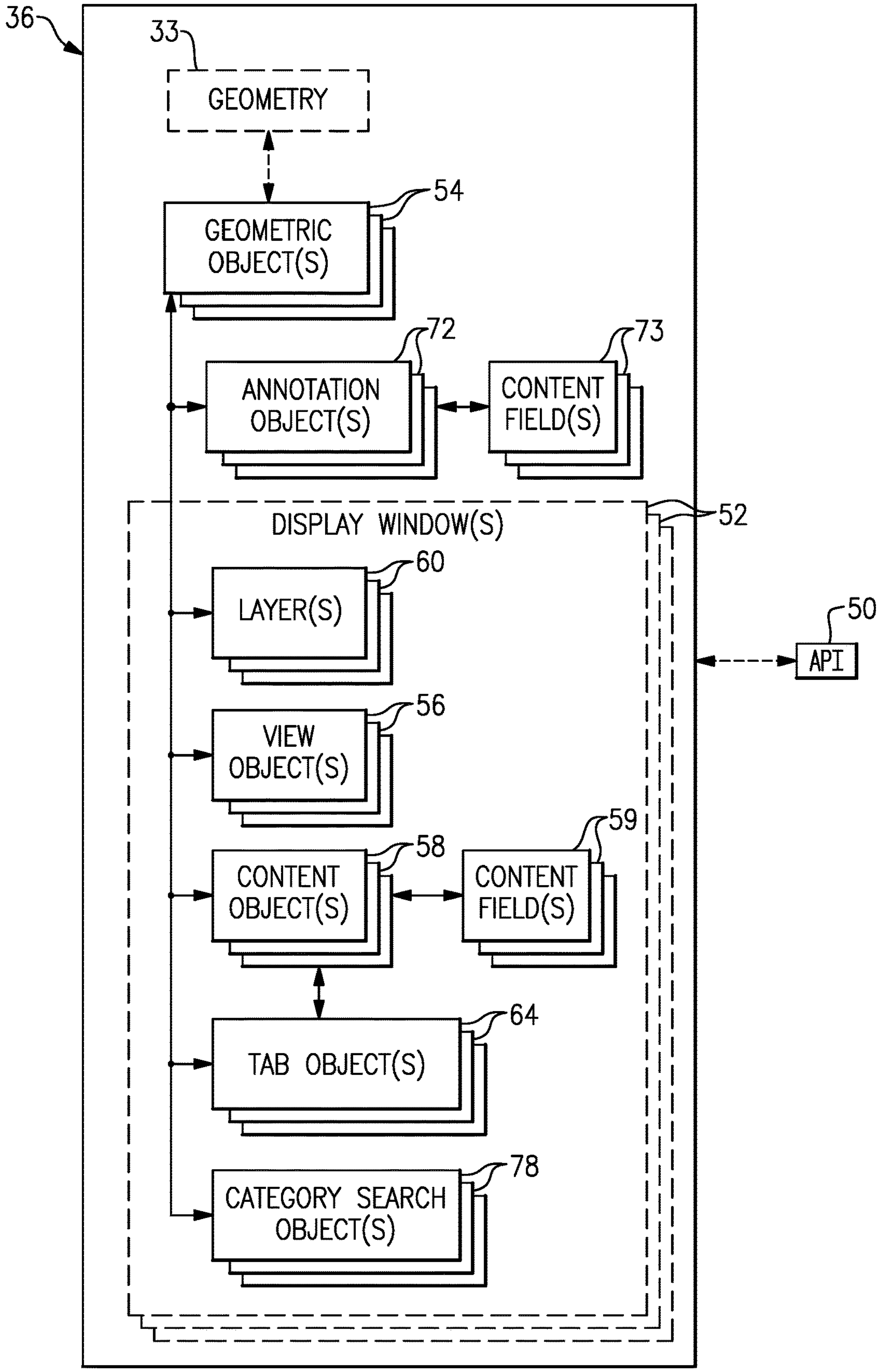
FIG. 3 discloses an arrangement of a tessellated model.

FIG. 3 schematically illustrates a tessellated model 36 according to an implementation. The tessellated model 36 may include any of the objects and associated structures disclosed herein. The tessellated model 36 may be established with respect to one or more data structures specified in the API 50. Various techniques may be utilized to establish relationships between the various objects of the tessellated model 36, including one or more static and/or dynamic links which may be specified in field(s) of the field objects. The API 50 may be utilized to establish the objects and links.

Figure 4A:
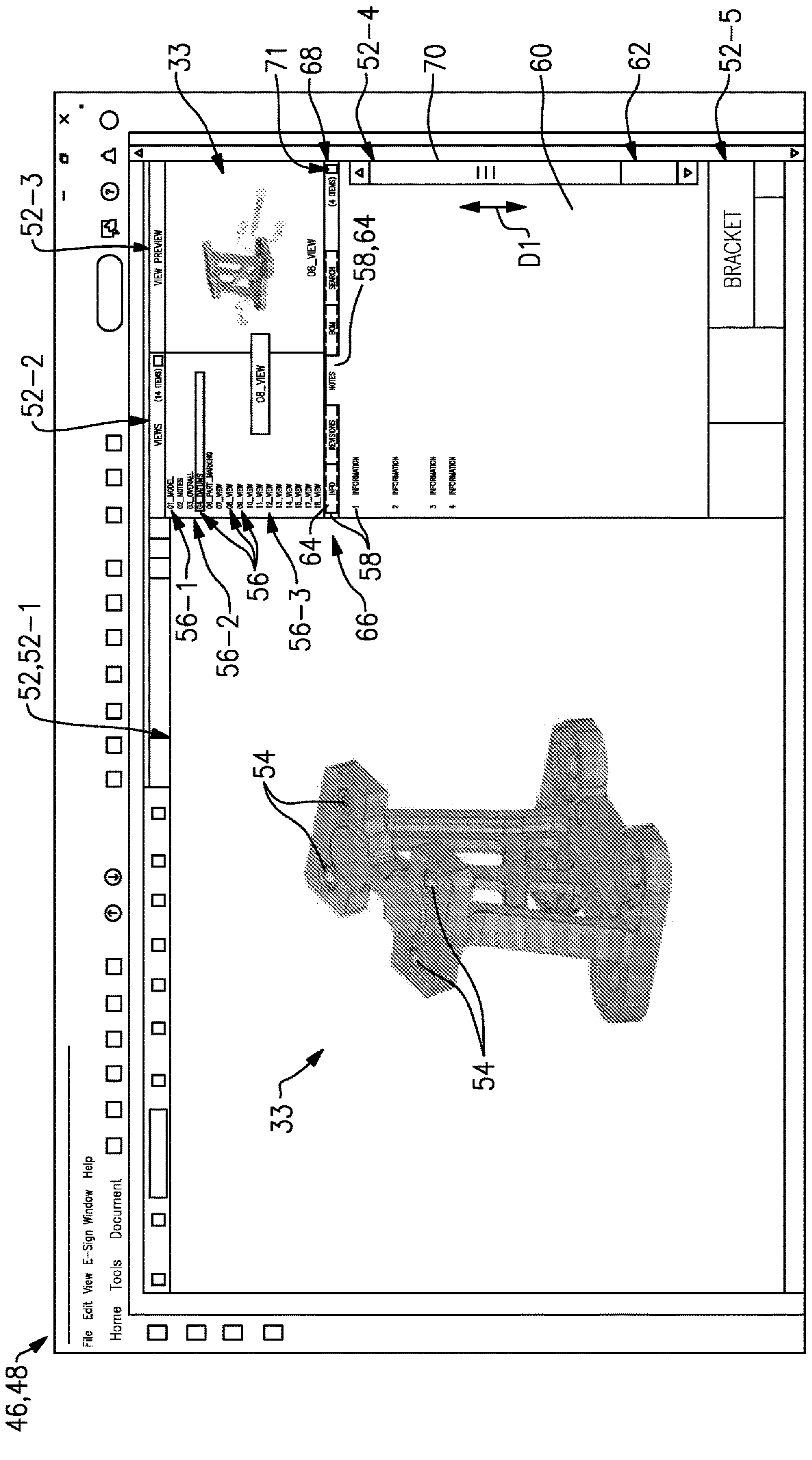
FIG. 4A discloses a graphical user interface for depicting geometry.

Referring to FIG. 4A, with continuing reference to FIGS. 1-3, the tessellated model 36 may establish a user interface 48. The user interface 48 may be suitable for a lightweight viewer, such as lightweight viewer 46, which may display the tessellated model 36 according to the API 50. FIG. 4A discloses an implementation of the lightweight viewer 46. The tessellated model 36 may include the tessellated geometry, information associated or presented with the tessellated geometry, and/or information utilized to establish the user interface 48.

The user interface 48 may be arranged in a manner that may declutter secondary information associated with the design geometry 33 such that a main viewing area may be relatively large. The user interface 48 may include one or more display windows 52 which may serve to divide the user interface 48 into different areas. In the implementation of FIG. 3, the display windows 52 may include a first (e.g., main) viewing window 52-1, a second (e.g., navigation) window 52-2, a third (e.g., preview) window 52-3, a fourth (e.g., information) window 52-4, and a fifth (e.g., information) window 52-5. The information window 52-4 may be a dynamic information window that may dynamically display information. The information may be contextual depending on what view the user may select. The information window 52-5 may be a persistent information window, which may always be visible in the user interface 48 and may display information without change. The information may include the title, part number, document number, etc. that may uniquely identify the design. Although the user interface 48 is shown with five display windows 52, it should be understood that fewer or more than five display windows 52 may be utilized in accordance with the teachings disclosed herein. The viewing window 52-1 and/or preview window 52-3 may be operable to display one or more depictions of the geometry 33. The windows 52-2, 52-4 and/or 52-5 may be operable to display various information relating to the geometry 33 and/or other aspects of the design. In implementations, the window(s) 52 may be operable to display information associated with one or more attributes specified in the lightweight file 37. Attribute(s) may be associated with the geometry 33 and/or depictions (e.g., views) of the geometry 33, but some attribute(s) may be specified at a global (e.g., file) level. The attributes may be specified in a header of the file 37.

The modeling environment 28 may be operable to generate one or more geometric objects 54. The modeling environment 28 may be operable to generate a tessellated model 36 that includes the geometric object(s) 54. The geometric objects 54 may establish a tessellation of geometry 33 (see, e.g., FIG. 2). The viewing window 52-1, preview window 52-3 and/or another display window 52 may be operable to display geometry 33 established by one or more geometric objects 54 of the tessellated model 36. The geometric objects 54 may be operable to display various depictions of the tessellation of the geometry 33 in the viewing window 52-1 and/or another window 52 of the user interface 48. Each of the geometric objects 54 may be associated with one or more graphics that may depict a geometry of the design. The depictions may include two-dimensional and/or three-dimensional views of the geometry 33 and may include solids, wireframes, transparencies, etc. The modeling environment 28 may be operable to store the tessellated models 36 in one or more lightweight files 37, which may be readable by the lightweight viewer 46. In implementations, the file(s) 37 may exclude any CAD models 32, including any CAD models 32 utilized to establish, or that may otherwise be related to, tessellated model(s) 36 of the respective geometry 33. The modeling environment 28 may be operable to store code (e.g., scripts, function calls, etc.) in the lightweight file 37 that may be operable to cause one or more functions associated with the tessellated model 36 to execute in the lightweight viewer 46, including any of the functions disclosed herein.

The modeling environment 28 may be operable to generate one or more view objects 56. Each of the view objects 56 may be associated with respective depictions of the geometric object(s) 54 associated with the geometry 33. The view objects 56 may be associated with the navigation window 52-2 and/or another window 52 of the user interface 48. The navigation window 52-2 may be operable to display one or more of the view objects 56, which may be depicted in a list. The viewing window 52-1 may be operable to display the depiction in response to user interaction or selection of the respective view object 56.

In implementations, the view objects 56 may include first, second, and third view objects 56-1 to 56-3. The view object 56-1 may be associated with an overall representation of the geometry 33. The second view object 56-2 may be associated with another depiction of the geometry 33, such as a depiction including one or more datums or other annotations (sec, e.g., FIG. 7). The viewing window 52-1 may be operable to display the depiction of the geometry 33 in response to selection of the respective view object 56. The preview window 52-3 may be operable to display a depiction of the geometry 33 associated with the respective view object 56 in response to user interaction. In implementations, a user may interact with the user interface 48 by positioning a cursor on or otherwise adjacent to the view object 56 to cause the preview window 52-3 to display the respective depiction (e.g., preview) of the geometry 33, which may be displayed in the viewing window 52-1 in response to selection of the view object 56 (e.g., mouse click).

The information window 52-4 may be operable to display information in the user interface 48. The information may be generic and/or may be associated with the geometry 33. The information window 52-4 may be dynamically linked to one or more of the geometric objects 54 such that selection of the geometric object 54 may cause information to update in the information window 52-4.

The modeling environment 28 may be operable to generate one or more content objects 58. The tessellated model (s) 36 may include the content object(s) 58. The content object(s) 58 may be operable to establish the information window 52-4. The content objects 58 may be operable to selectively display information associated with the tessellated model 36 and/or respective geometry 33 in a common display region 62 and/or another portion of the user interface 48. The content objects 58 may be operable to establish the information window 52-4 such that the common display region 62 may be spaced apart from, but may be concurrently displayed with, the viewing window 52-1 in response to opening the tessellated model 36 in the lightweight viewer 46.

The content objects 58 may be assigned various information, including information associated with the tessellated model 36. The information may be assigned to content fields 59 associated with the respective content objects 58 (FIG. 3). In implementations, the content fields 59 may be associated with information specified in a data structure (e.g., template) readable by the lightweight viewer 46. The lightweight file 37 may store the information in the data structure according to the API 50. In other implementations, the information may be stored directly in the respective content fields 59. The content field 59 may be a portion of the content object 58 or may be another object linked to the content object 58. Various techniques may be utilized to define the information associated with the content fields 59, including various data types or structures such as character, string, integer, boolean, array, date, time, etc. In implementations, the content fields 59 may contain code (e.g., script), which may be executable by the API 50 and/or lightweight viewer 46. The information assigned to the content objects 58 may be the same or may at least partially differ from information assigned to other content objects 58. The information may be associated with various details of the organization responsible for the CAD model 32. The information may include a revision history of the CAD model 32, various notes or statements associated with the CAD model 32, a bill of material (BOM) associated with component(s) represented by the geometry 33, etc. The content objects 58 may be operable to display information assigned to the respective content field 59 in respective portions of the information window 52-4.

The modeling environment 28 may be operable to generate one or more content layers 60. The layers 60 may be respective objects of the tessellated model 36. Each content object 58 may be associated with one or more of the layers 60. The content objects 58 may be assigned (e.g., occupy) the same view location in the user interface 48 but may be assigned to different layers 60 of the model 36. At least some of the layers 60 may occupy the common display region 62 of the user interface 48. The layers 60 may be dimensioned to at least partially, substantially, or completely overlap with each other in the common display region 62. The content objects 58 may be operable to selectively display information associated with the tessellated model 36 in response to user interaction with or selection of the respective content object 58 such that the respective layer 60 may be activated, but a remainder of the layers 60 may be deactivated in the common display region 62.

Various techniques may be utilized to establish the layers 60 in the user interface 48. The modeling environment 28 may be operable to establish a tabbed interface 66. The tabbed interface 66 may be utilized to display information relating to the geometry 33 and/or other aspects of the tessellated model 36. Each viewable tab of the tabbed interface 66 may be established by at least two objects. One object may be associated with the tab name (e.g., tab object 64) and another object may be associated with the respective information area (e.g., content object 58). The user may interact with a control object 71 in the user interface 48 to open a separate document containing a full listing of applicable tabs. Prior systems may include a model tree window having one or more tabs for displaying various information, such as a model tree, model views, product manufacturing information (PMI), etc., specified in a data stack. However, the model tree window may be provided by the application itself independent of any particular lightweight file, instead of being established by objects stored in the lightweight file.

The modeling environment 28 may be operable to generate one or more tab objects 64. The tessellated model 36 may include the tab objects 64. The information window 52-4 may be established by the tab object(s) 64 and control objects 58. The tab objects 64 may be operable to graphically depict the tabbed interface 66 in the information window 52-4 or another portion of the user interface 48. The tab objects 64 may be arranged in an array to graphically depict the tabbed interface 66. The tab objects 64 may be arranged in a row or may otherwise be offset from each other. The tabbed interface 66 may be directly adjacent to the common display region 62. The tab objects 64 may be associated with one or more content objects 58. Each tab object 64 may be associated with a respective layer 60 and one or more content objects 58 assigned to the layer 60. Each of the layers 60 and/or respective tab objects 64 may be associated with an activated state and a deactivated state. The tab objects 64 may be operable to graphically depict the current states in the user interface 48. The layers 60 may be made visible or invisible based on selection of the tab object 64. One layer 60 may be selectively visible at a time. Each of the tab objects 64 may be operable to selectively activate the layer 60 of the respective content object(s) 58 and deactivate a remainder of the layers 60 associated with the information window 52-4 in response to user interaction or other selection of the respective tab object 64.

Figure 5:
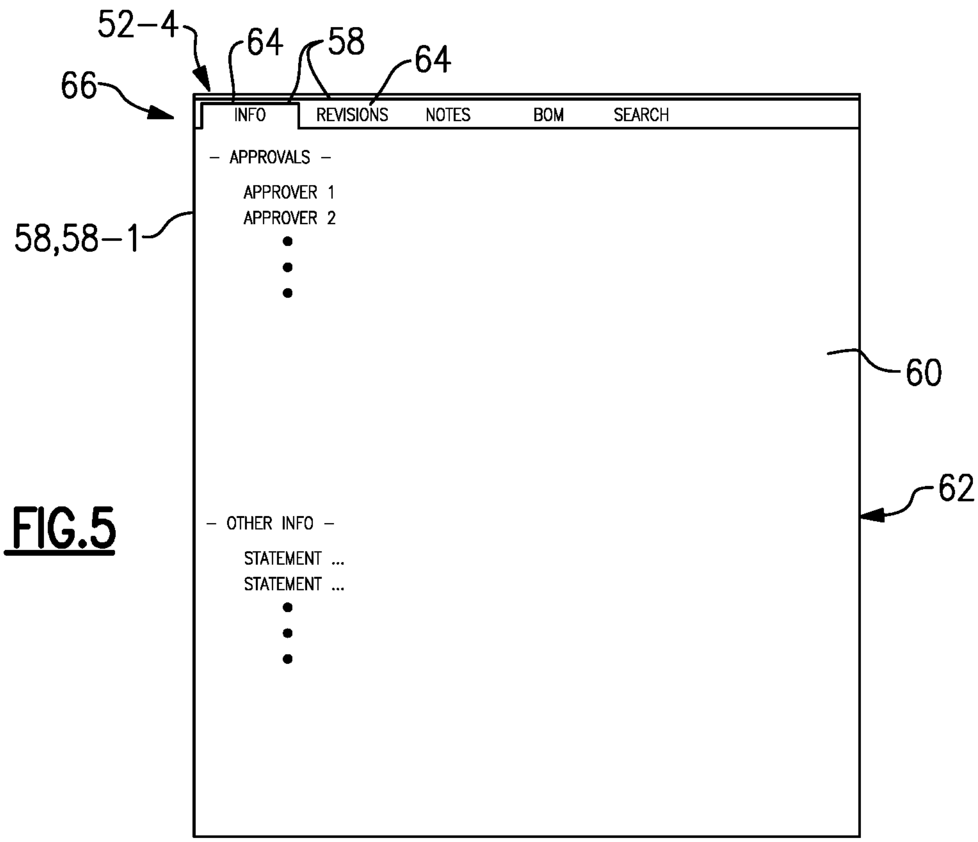
FIG. 5 discloses an arrangement of the user interface of FIG. 4A.

In the implementation of FIG. 5, the content objects 58 may include a first content object 58-1. The content object 58-1 may be associated with various information relating to personnel(s) and/or organization(s) assigned to designing, reviewing, manufacturing, etc., of the component(s), assembly or system.

Figure 4B:
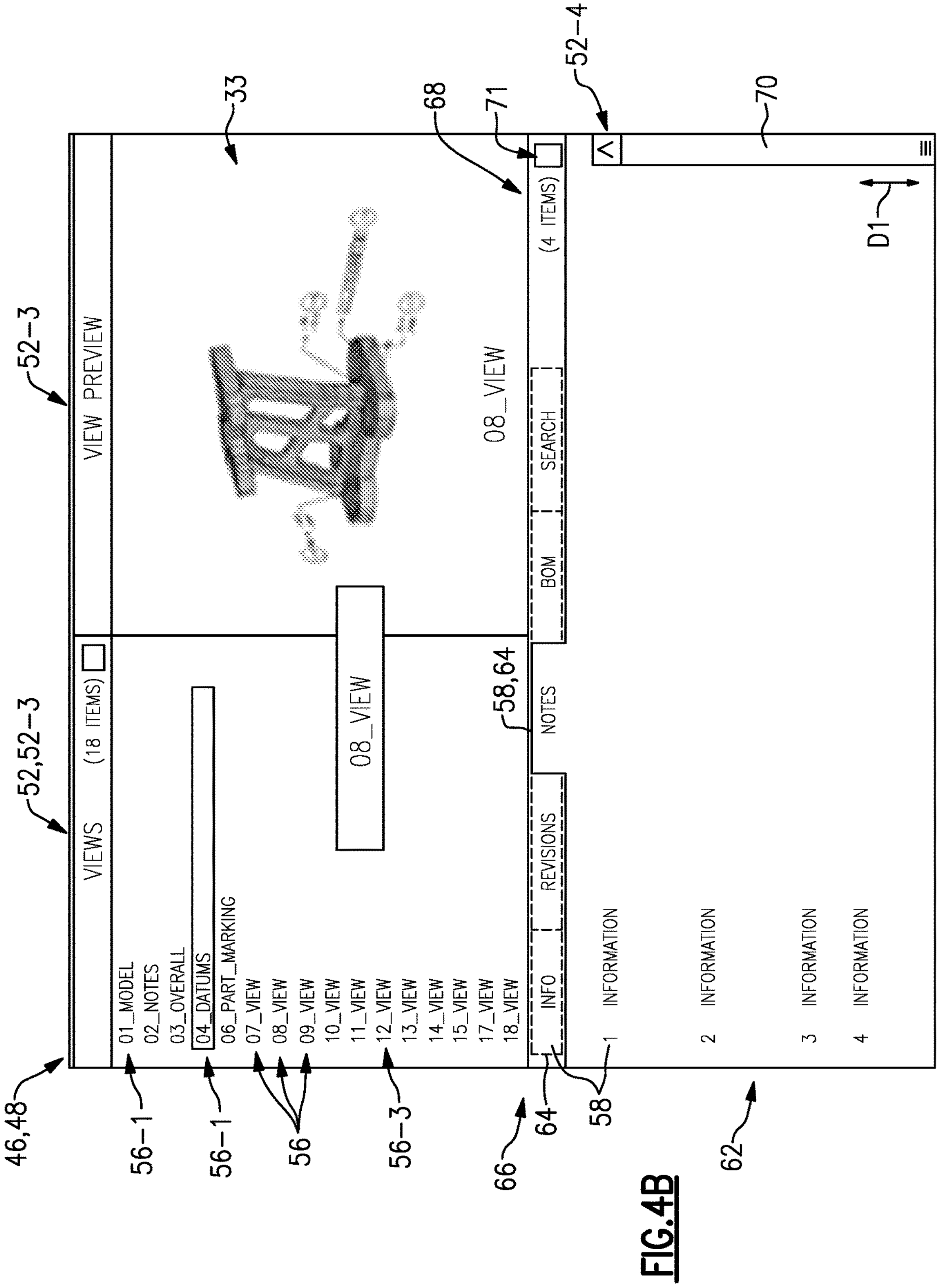
FIG. 4B discloses selected portions of the user interface of FIG. 4A.
Figure 6:
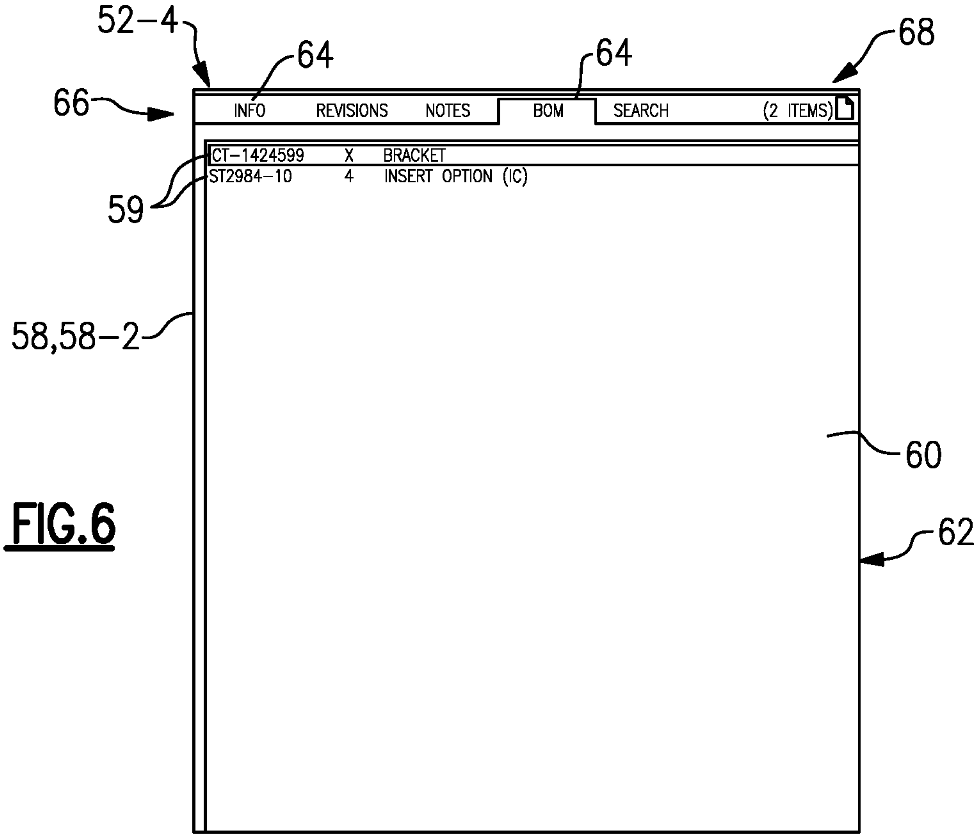
FIG. 6 discloses another arrangement of the user interface of FIG. 4A.

The modeling environment 28 may be operable to dynamically link one or more of the content objects 58 to one or more of the view objects 56 such that contents of a list or other information assigned to the content objects 58 may update in response to user interaction with or selection of the respective view objects 56. One or more of the content objects 58 may be dynamically linked to one or more of the view objects 56 such that the content fields 59 and/or other information assigned to the respective content objects 58 may update in response to selection of the respective view object 56. In the implementation of FIG. 6, the content objects 58 may include a second content object 58-2. The second content object 58-2 may be operable to display a bill of material (BOM) associated with the design. The content fields 59 of the associated content object 58-2 may be depicted graphically as a list. In implementations, the list may be an interactive list. The content fields 59 associated with the respective content object 58-2 may be dynamically linked to one or more of the respective view objects 56. Selection of a respective view object 56 from the navigation window 52-2 may cause the interactive list to update such that content of the content fields 59 associated with the respective content object 58 may be displayed in the common display region 62 according to the selected view object 56. The content displayed in the list may include unique identifiers (e.g., part numbers, names, descriptions, etc.) assigned to the associated geometric objects 54 and related information (see, e.g., FIGS. 4A-4B). In implementations, the content object 58-2 may include a content field associated with each of the respective geometric objects 54. The content object 58-2 may be operable to selective display of content in the content fields 59 in response to selection of the respective view object 56.

The information displayed in the information window 52-4 may include one or more statements. The statements may be established by one or more respective content fields 59. The content objects 58 may be operable to establish a list associated with a quantity of the statements assigned to the content fields 59 of the respective content object 58.

Each tab may be associated with a counter. The content objects 58 may be associated with a counter object 68 that may establish the counter. The counter object 68 may be arranged adjacent to the common display region 62. The counter object 68 may be operable to indicate a quantity of the statements assigned to the respective content objects 58 that may be currently indicated in the list.

Referring back to FIGS. 4A-4B, each tab may be associated with a control object 70 for interacting with information in the tabbed interface 66. The user may interact with the control object 70 to view the associated information, which may be useful in decluttering the information window 52-4 by reducing the size of the information area. One or more of the content objects 58 may be associated with the control object 70. The control object 70 may be adjacent to the common display region 62. The tessellated model 36 may include the control object 70. The control object 70 may be operable to cause a visible portion of the activated layer 60 to vary in response to user interaction. The control object 70 may be a scroll bar object. The scroll bar object 70 may be moveable in direction D1. The scroll bar object 70 may be manipulated by the user to view information displayed in the common display region 62. The counter object 68 may indicate that more items are available, which may be useful by suggesting that the user may interact with the scroll bar object 70 to view the additional information.

Figure 8:
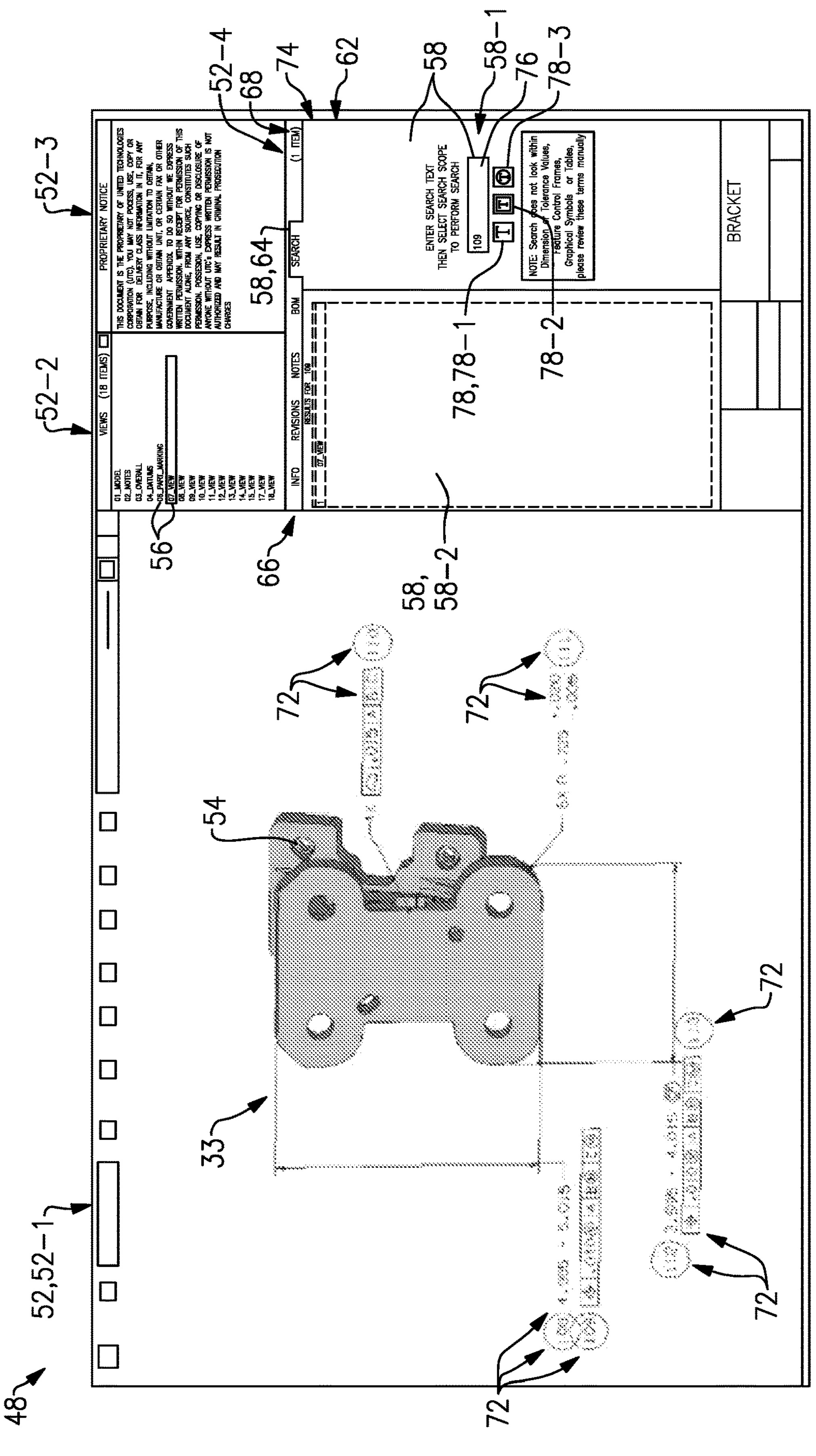
FIG. 8 discloses a search window of the user interface.

Referring to FIG. 8, with continuing reference to FIGS. 1 and 3, the CAD model 32 may include various annotations associated with a design. The annotations may include identifiers, datums, etc. The modeling environment 28 may be operable to establish a representation of the annotation(s) in the tessellated model 36. The disclosed techniques may be utilized to search the graphical objects 54 and the text or other information attached to them. Standard search tools that may be provided by the lightweight viewer 46 may not be configured to search annotations within the main viewing window 52-1 because the text graphically depicted are objects. The disclosed techniques allow the user to search within the 2D and/or 3D graphical depictions of the geometry 33 and associated annotations.

The modeling environment 28 may be operable to generate one or more annotation objects 72. The tessellated model 36 may include the annotation object(s) 72. The annotation objects 72 may be assigned information associated with one or more respective geometric objects 54. The information may include one or more annotations specified by the design. The information may be stored in content field(s) 73 of the annotation object(s) 72 (FIG. 3). The information associated with the annotation objects 72 may be the same or may be different. Each of the annotation objects 72 may be operable to depict the respective information as a graphical annotation in the viewing window 52-1. The graphical annotation may be depicted adjacent to the geometry 33. Each annotation object 72 may be associated with one or more view objects 56. In implementations, each annotation object 72 may be linked to a single view object 56 such the set of annotations may differ for the depictions of the geometry 33 (see, e.g., FIGS. 7 and 8).

Since the annotations are graphically depicted in the display window 52, the graphical depictions may not be directly searchable by the lightweight viewer 46. The user may interact with the user interface 48 to search for specified annotations in the tessellated model 36 by querying text or other information that may be attached to objects associated with the graphical depictions. One or more content objects 58 may establish a search window 74 of the user interface 48. The search window 74 may be a portion of the information window 52-4. The search window 74 may be spaced apart from, but may be concurrently displayed with, the viewing window 52-1.

The content objects 58 may include a query object 58-1 and a results object 58-2. The results object 58-2 may be dynamically linked to the query object 58-1. The query object 58-1 may establish a query input field 76. The query input field 76 may be operable to query the information assigned to the annotation objects 72, including information in the content fields 73, in response to user input. In implementations, the query input field 76 may be text box that may accept a search string. The input may be specified in the query input field 76. The user may interact with the user interface 48 to indicate one or more characters in the query input field 76 for performing a query of the annotation information. The results object 58-2 may be operable to display a list of results meeting the query. The list may be a table of the results including information associated with the respective objects.

Figure 7:
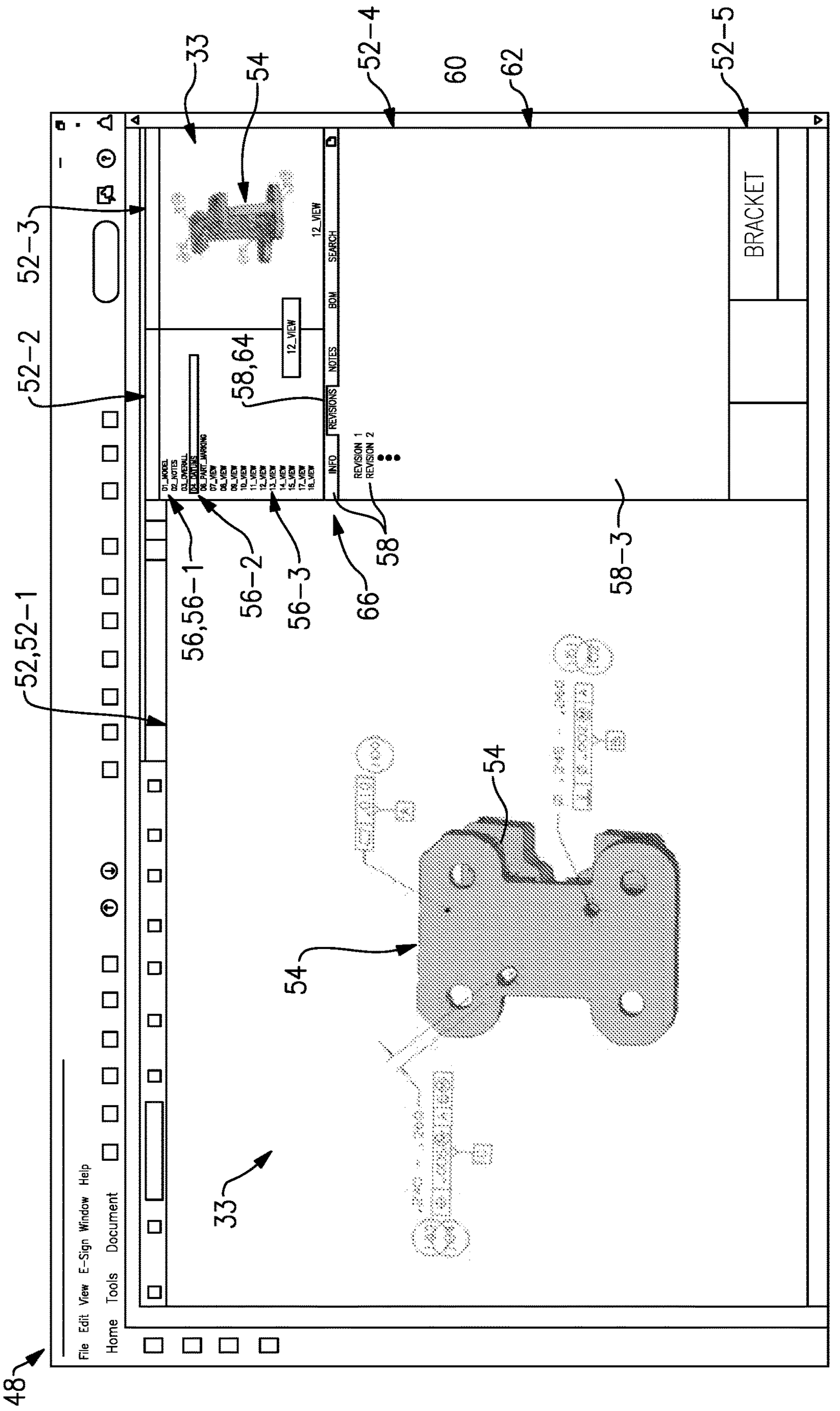
FIG. 7 discloses another depiction of the geometry in the user interface of FIG. 4A.

Each of the view objects 56 may be operable to establish a respective depiction of the geometry 33 in the viewing window 52-1 and/or preview window 52-3 (sec, e.g., FIG. 7). The modeling environment 28 may be operable to link each of the annotation objects 72 to one or more of the view objects 56. The annotation objects 72 may be operable to graphically depict an annotation adjacent the depiction of the geometry 33 established by the respective view object 56.

The results object 58-2 may be operable to generate a list of the view objects 56 that are associated with at least one annotation object 72 having content in the content object(s) 73 that meets the query. In implementations, the results object 58-2 may be operable to generate an interactive list of the view objects 56. In implementations, the view objects 56 may be identified in the navigation window 52-2, but only any view objects 56 meeting the query may be identified in the list of results. The results may include a linked list of the view objects 56. The results object 58-2 may be dynamically linked to one or more of the view objects 56 such that selection of a result from the list may cause a depiction (e.g., representation) of the geometry 33 to change in the viewing window 52-1 (see, e.g., FIGS. 7 and 8). The viewing window 52-1 may be operable to display the depiction of the geometric object(s) 54 in response to selection of the associated result from the list. The user may select a result from the list to cause the viewing window 52-1 to display a depiction of the geometry 33 associated with the respective view object 56.

The annotations may be associated with one or more annotation types for conveying various design and/or manufacturing information to the user. The annotation objects 72 may be associated with a set of annotation types. The annotation types may include an identifier (e.g., bubble) annotation type, a datum annotation type, etc. The identifier annotation type may be useful for identifying other (e.g., more detailed) annotations in the display window 52. The datum annotation type may be associated with datums relating to manufacturing the geometry 33. The annotation objects 72 may graphically depict the datums as boxes adjacent to the model geometry 33.

The query section of the search window 74 may be categorized by annotation and/or object type. In implementations, the query section may include a set of three selectable indicators associated with different types of objects. Although three indicators are disclosed, its should be understood that fewer or more than three indicators may be utilized in accordance with the teachings disclosed herein.

The content objects 58 may include one or more category search objects 78. Each category search objects 78 may be associated with one or more of the annotation types. The category search objects 78 may be operable to limit the query to the respective annotation type(s) in response to user interaction or selection of the respective category search object 78.

In the implementation of FIGS. 8-11, the category search object 78 may include first, second and third category search objects 78-1 to 78-3. The first category search object 78-1 may be operable to cause the query object 58-1 to query all text and other content in the content field(s) 73 of the annotation object(s) 72. In other implementations, the first category search object 78-1 may be operable to cause the query object 58-1 to query any text or other content in the content field(s) 73 of the annotation object(s) 72 except for text or content associated with any annotation types assigned to the other content search object(s) 78-2 and/or 78-3. The second category search object 78-2 may be operable to limit the query to the datum annotation type. The third category search object 78-3 may be operable to limit the query to the identifier (e.g., bubble) annotation type, which may be useful for quickly identifying a particular annotation in the tessellated model 36. The third category search object 78-3 may be operable to limit the search to text within bubble annotations.

The results object 58-2 may be associated with the counter object 68. The counter object 68 may be operable to indicate a quantity of results in the list depicted by the results object 58-2.

Figure 9:
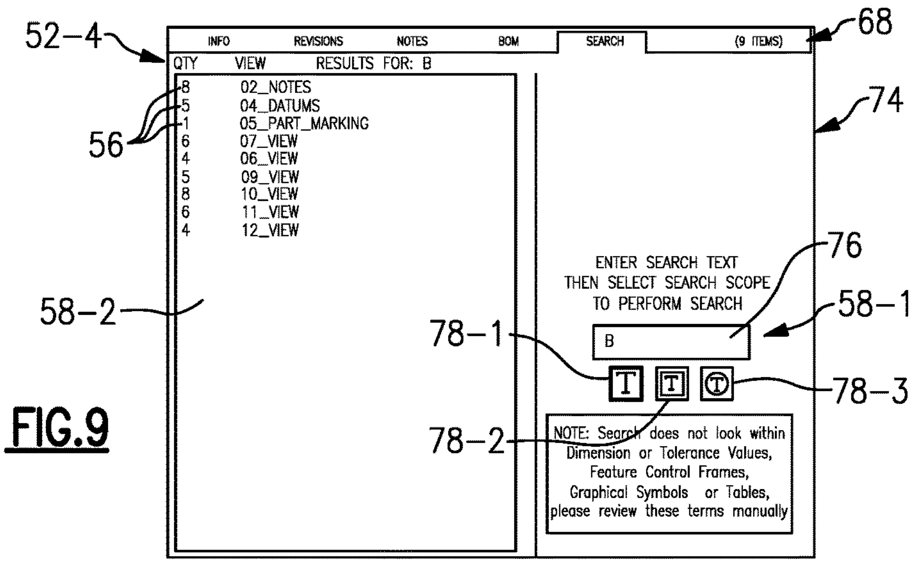
FIG. 9 discloses an implementation of the search window of FIG. 8.

In the implementation of FIG. 9, user may select the first category search object (e.g., text indicator) 78-1. The user may indicate a character string (e.g., "B") in the query input field 76. The query object 58-1 may query the content field(s) 73 for any annotations that meet the character string. The results may include any annotations meeting the query. In implementations, the query object 58-1 may exclude annotations associated with the other category search object (s) 78-2, 78-3 (e.g., datum and identifier annotations). The results object 58-2 may be operable to display the results, which may be a list of annotations meeting the query. The counter object 68 may indicate a total number of the view objects 56 having at least one annotation that meets the query (e.g., 9 items). The results object 58-2 may be operable to display the total number of annotations meeting the query for each of the view objects 56 linked to the respective annotation object 72 (see, e.g., left column of table).

Figure 10:
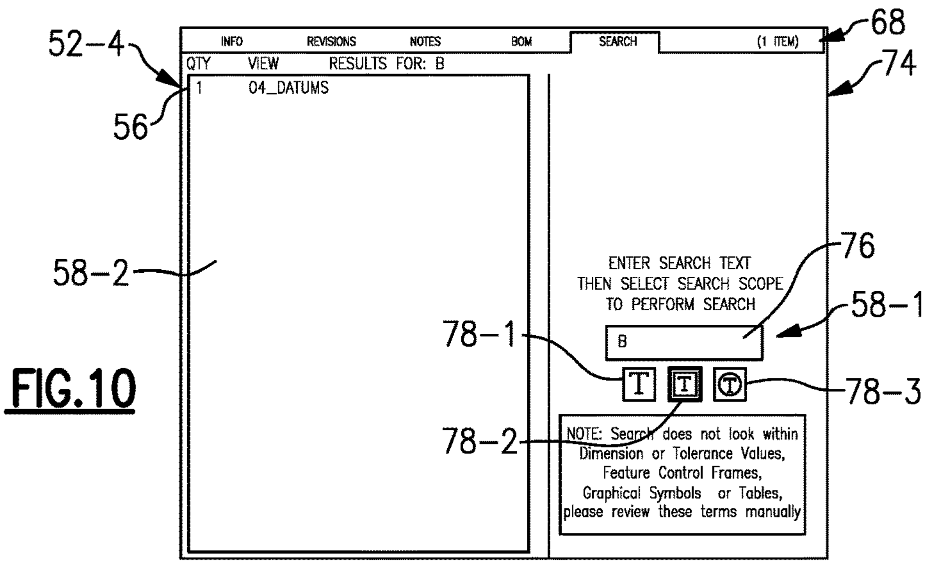
FIG. 10 discloses another implementation of the search window of FIG. 8.

In the implementation FIG. 10, the user may select the second category search object (e.g., datum indicator) 78-2. The user may indicate a character string (e.g., "B") in the query input field 76. The query object 58-1 may query the content field(s) 73 for datum annotations that meet the character string. The results object 58-2 may be operable to display the results, which may be a list of datums meeting the query. The counter object 68 may indicate a total number of the view objects 56 having at least one datum that meets the query (e.g., 1 item).

Figure 11:
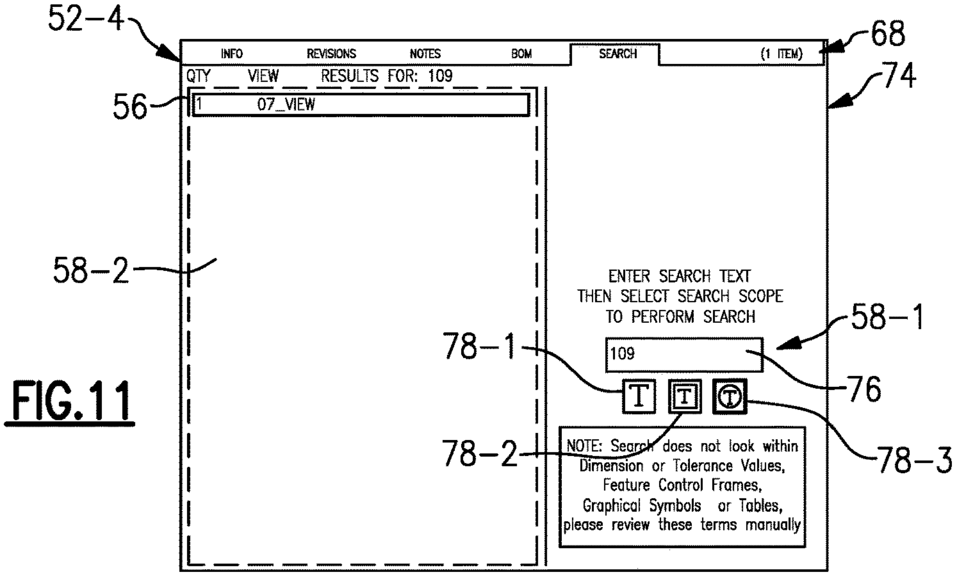
FIG. 11 discloses another implementation of the search window of FIG. 8.

In the implementation of FIG. 11, the user may select the third category search object (e.g., bubble indicator) 78-3. The user may indicate a character string (e.g., "109") in the query input field 76. The query object 58-1 may query the content field(s) 73 for identifier annotations that meet the character string. The results object 58-2 may be operable to display the results of the query. The counter object 68 may indicate a total number of the view objects 56 having at least one identifier annotation that meets the query (e.g., 1 item).

Figure 12:
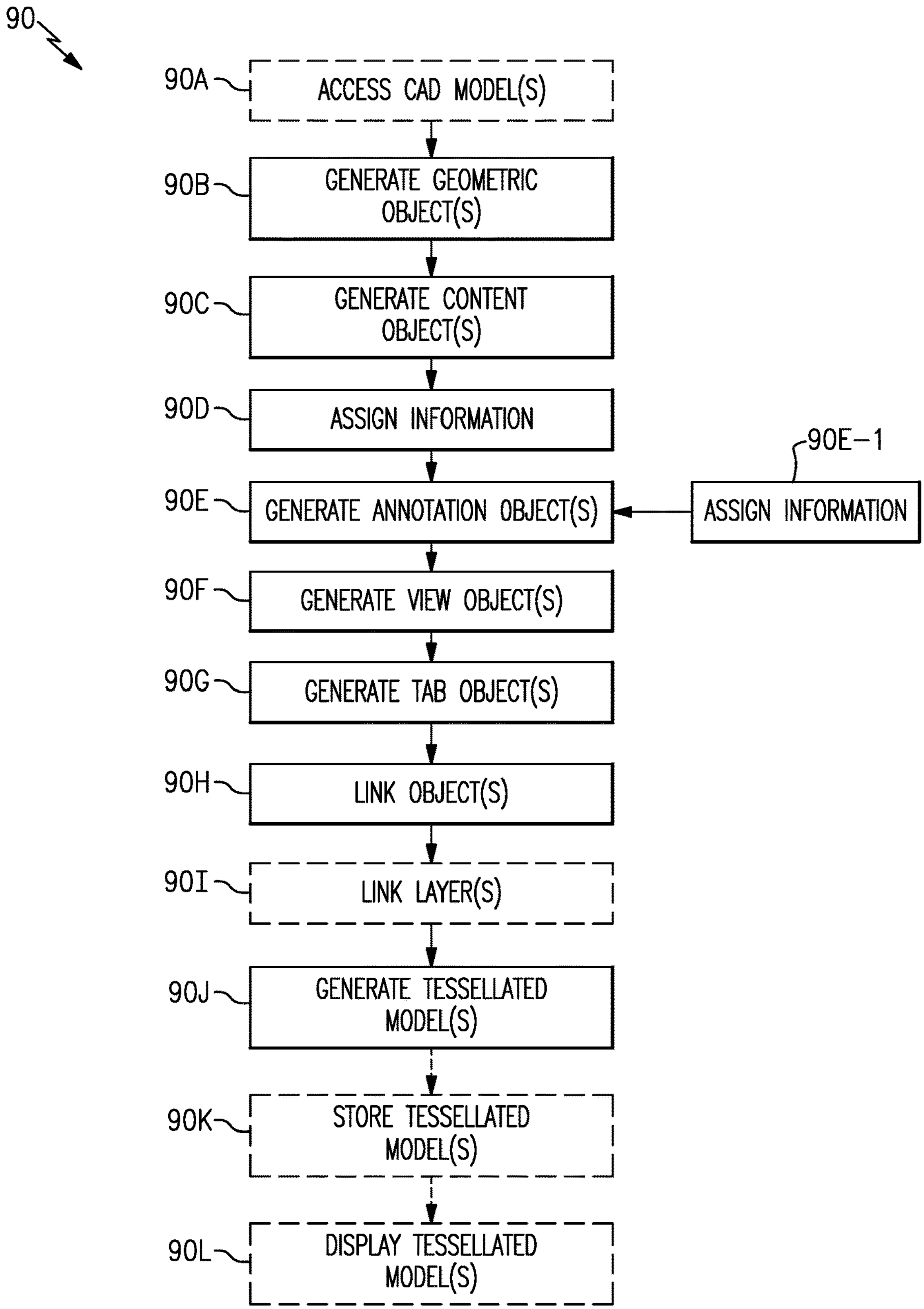
FIG. 12 discloses a method of generating a tessellated model.

FIG. 12 discloses a method of establishing and/or interacting with a tessellated model in a flow chart 90 according to an implementation. The method 90 may be utilized to generate one or more tessellated models associated with design geometry. The geometry may be defined in one or more associated CAD models. The tessellated models may exclude any CAD models associated with the geometry. Fewer or additional steps than are recited below could be performed within the scope of this disclosure, and the recited order of steps is not intended to limit this disclosure. The modeling environment 28 may be programmed with logic for performing method 90. Reference is made to the system 20.

Referring to FIG. 1, with continuing reference to FIG. 12, one or more CAD models 32 may be accessed at step 90A. The CAD model 32 may be associated with respective geometry 33. A CAD system 30 may be utilized to define the geometry 33 in the CAD model 32.

Referring to FIGS. 2-4A, with continuing reference to FIGS. 1 and 8, one or more geometric objects 54 may be generated at step 90B. The geometric objects 54 may establish a tessellation of the geometry 33, which may be stored in a tessellated model 36. The geometric objects 54 may be operable to display the tessellation of geometry 33 in the viewing window 52-1 and/or another display window 52 of the user interface 48.

Referring to FIGS. 3-4, with continuing reference to FIGS. 1 and 12, one or more content objects 58 may be generated at step 90C. The content objects 58 may be operable to establish the information window 52-4 of the user interface 48. Step 90C may include associating the content objects 58 with respective layers 60 that may occupy the common display region 62 of the user interface 48. The content objects 58 may be operable to establish the information window 52-4 such that the common display region 62 may be spaced apart from, but may be concurrently displayed with, the viewing window 52-1 in the user interface 48.

The content objects 58 may be operable to establish a search window 74 of the user interface 48. The content objects 58 may include a query object 58-1 and a results object 58-2. The results object 58-2 may be dynamically linked to the query object 58-1. The query object 58-1 may be operable to query information assigned to the annotation object(s) 72 in response to user input. The results object 58-2 may be operable to display a list of the results meeting the query in the search window 74.

At step 90D, information associated with the geometry 33 and/or other information may be assigned to the content objects 58. In implementations, the information may be stored in one or more content fields 59. The information may be displayed utilizing any techniques disclosed herein. The content objects 58 may be operable to selectively display the respective information in the common display region 62 of the user interface 48.

At step 90E, one or more annotation objects 72 may be generated. Generating the annotation objects 72 may include assigning information associated with annotations of the geometric objects 54 to the respective content fields 73 at step 90E-1. Each of the annotation objects 72 may be operable to depict the respective information as a graphical annotation in the viewing window 52-1. The graphical annotation can include any annotation as disclosed herein, such as identifiers, datums (e.g., dimensions, tolerances, etc.), and other information that may be associated with the geometric objects 54 and/or geometry 33 of the design. Assigning the information at step 90E-1 may include assigning the content field 73 of each of the annotation objects 72 to at least one or more of the annotation types. The assigned annotation type may be specified in a separate content field 73 of the annotation object 72. The annotation types may include any of the annotation types disclosed herein. The content objects 58 may include one or more category search objects 78 that may each be associated with one or more of the annotation types. The category search objects 78 may be operable to limit the query to the respective annotation type(s) in response to user action.

At step 90F, one or more view objects 56 may be generated. The view objects 56 may be associated with respective depictions of the geometry 33.

At step 90G, one or more tab objects 64 may be generated. The tab objects 64 may be operable to depict the tabbed interface 66 in the information window 52-4. Each tab object 64 may be associated with one or more of the content objects 58.

At step 90H, one or more of the objects may be linked to other object(s) of the tessellated model 36, including any of the objects disclosed herein. The objects may include the geometric objects 54, view objects 56, content objects 58, tab objects 64, counter objects 68, control objects 70, annotation objects 72 and/or category search objects 78.

At step 90I, one or more of the objects may be linked to one or more respective layers 60. Each of the tab objects 64 may be operable to selectively activate the layer 60 of the respective content object(s) 58 and deactivate the remainder of the layers 60 associated with the information window 52-4 and/or another portion of the user interface 48 in response to user interaction with or selection of the respective tab object 64.

At step 90J, one or more tessellated models 36 may be generated. The tessellated models 36 may be generated utilizing any of the techniques disclosed herein. The tessellated model 36 may include any of the objects and features disclosed herein, such as the geometric objects 54, content objects 58, layers 60, tab objects 64, counter objects 68, control objects 70, annotation objects 72, and/or category search objects 78.

Linking the objects at step 90H may include dynamically linking one or more of the content objects 58 to one or more of the view objects 56 such that the information assigned to the respective content object 58 may update in response to user action with the respective view object 56. In implementations, the content objects 58 may be operable to display a list and/or table of the information which may be dynamically updated in response to selection of the view object 56. Step 90H may include dynamically linking the results object 58-2 to the annotation objects 72 such that selection of a result from the list (e.g., identifier associated with the respective view object 56) may cause a depiction of the geometry 33 to change in the viewing window 52-1. The depiction may be established by the respective view object 56.

At step 90K, the tessellated model(s) 36 may be stored in one or more lightweight files 37. The files 37 may exclude the CAD model(s) 32 associated with the respective geometry 33.

At step 90L, the tessellated model(s) 36 may be displayed in a lightweight viewer 46. Step 90L may include establishing the user interface 48 in the display according to the objects of the tessellated model 36. The tessellated model 36 may cause the lightweight viewer 46 to execute code including one or more scripts, which may be specified in the content fields 59 of the content objects 58 or may otherwise be embedded in the tessellated model 36. Step 90L may include displaying one or more depictions of the geometry 33 in the display window(s) 52.

The systems and methods disclosed herein may be utilized to generate tessellated models associated with geometry of one or more components, assemblies and/or systems. The tessellated models may be stored in relatively compact files, which may be readable by a lightweight viewer provided to users who may not have access to a CAD system. The user may interact with a search window to search for annotation objects in the 2D and/or 3D space of a lightweight viewer. Utilizing the techniques disclosed herein, the user may quickly search and locate annotation information. The search results may be displayed in an interactive list of specific annotation objects and/or types. The user may quickly manipulate the display to view the searched objects without having to traverse many depictions of the model to locate any objects of interest. The disclosed techniques may be utilized to declutter the amount of information simultaneously presented to the user.

Although the different examples have the specific components shown in the illustrations, embodiments of this disclosure are not limited to those particular combinations. It is possible to use some of the components or features from one of the examples in combination with features or components from another one of the examples.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A system including a user interface for a lightweight viewer, the user interface executable on a computing device and comprising:

a computing device operable to execute a modeling environment including a user interface, the user interface including a viewing window and a search window;

wherein the viewing window is operable to display geometry established by one or more of geometric objects included in a tessellated model, wherein one or more annotation objects included in the tessellated model are assigned information associated with the respective one or more geometric objects, and the one or more annotation objects are operable to depict the respective information as a graphical annotation in the viewing window; and wherein the search window is established by a plurality of content objects included in the tessellated model, the content objects including a query object and a results object dynamically linked to the query object, wherein the query object establishes a query input field operable to query the information of the one or more annotation objects based on input in the query input field, and the results object is operable to display a list of results meeting the query.

2. The system as recited in claim 1, wherein selection of a result from the list causes a depiction of the geometry to change in the viewing window.

3. The system as recited in claim 2, further comprising:

a navigation window operable to display one or more view objects, the one or more view objects associated with a respective depiction of the one or more geometric objects;

wherein the list of results includes the one or more view objects meeting the query; and wherein the viewing window is operable to display the depiction in response to selection of the associated result.

4. The system as recited in claim 3, wherein the one or more annotation objects include a plurality of annotation objects associated with the one or more view objects.

5. The system as recited in claim 4, wherein the one or more view objects include a plurality of view objects, and the annotation objects include a first annotation object and a second annotation object associated with one or more different view objects.

6. The system as recited in claim 1, wherein the one or more annotation objects are associated with a set of annotation types, the content objects include one or more category search objects each associated with one or more of the annotation types, and the category search objects are operable to limit the query to the respective one or more annotation types in response to user interaction.

7. The system as recited in claim 6, wherein the annotation types include an identifier annotation type and a datum annotation type.

8. The system as recited in claim 1, wherein the results object is associated with a counter object, and the counter object is operable to indicate a quantity of results in the list.

9. The system as recited in claim 1, wherein the search window is spaced apart from, but concurrently displayed with, the viewing window.

10. The system as recited in claim 1, wherein the tessellated model excludes any CAD model associated with the geometry.

11. The system as recited in claim 10, wherein the modeling environment is operable to:

store the tessellated model in a file readable by a lightweight viewer, the file excluding the CAD model.

12. The system as recited in claim 11, wherein the modeling environment is operable to:

store code in the file that is operable to cause one or more functions associated with the tessellated model to execute in the lightweight viewer.

13. A system for generating a tessellated model comprising:

a computing device including one or more processors coupled to memory;

wherein the computing device is operable to execute a modeling environment, and the modeling environment is operable to:

access a computer-aided design (CAD) model associated with geometry;

generate one or more geometric objects that establish a tessellation of the geometry;

generate one or more annotation objects assigned information associated with the respective one or more geometric objects;

generate a plurality of content objects;

generate a tessellated model including the one or more geometric objects, the one or more annotation objects and the content objects;

wherein the one or more geometric objects are operable to display the tessellation of the geometry in a viewing window of a user interface;

wherein the one or more annotation objects are operable to depict the respective information as a graphical annotation in the viewing window; and wherein the content objects are operable to establish a search window of the user interface, the content objects include a query object and a results object dynamically linked to the query object, the query object is operable to query the information of the one or more annotation objects in response to user input, and the results object is operable to display a list of results meeting the query.

14. The system as recited in claim 13, wherein the search window is spaced apart from, but concurrently displayed with, the viewing window.

15. The system as recited in claim 13, wherein the one or more annotation objects are associated with a set of annotation types, the content objects include one or more category search objects each associated with one or more of the annotation types, and the category search objects are operable to limit the query to the respective one or more annotation types in response to user interaction.

16. The system as recited in claim 13, wherein selection of a result from the list causes a depiction of the geometry to change in the viewing window.

17. A method of establishing a tessellated model comprising:

generating one or more geometric objects that establish a tessellation of geometry stored in a computer-aided design (CAD) model, wherein the one or more geometric objects are operable to display the tessellation of the geometry in a viewing window of a user interface;

generating one or more annotation objects;

assigning information associated with the respective one or more geometric objects to the one or more annotation objects, wherein the one or more annotation objects are operable to depict the respective information as a graphical annotation in the viewing window;

generating a plurality of content objects, wherein the content objects are operable to establish a search window of the user interface, wherein the content objects include a query object and a results object dynamically linked to the query object, the query object is operable to query the information of the one or more annotation objects in response to user input, and the results object is operable to display a list of results meeting the query; and generating a tessellated model including the one or more geometric objects, the one or more annotation objects and the content objects.

18. The method as recited in claim 17, the results object is operable to causes a depiction of the geometry to change in the viewing window in response to selection of a result from the list.

19. The method as recited in claim 17, further comprising:

assigning the one or more annotation objects to one or more annotation types; and wherein the content objects include one or more category search objects operable to limit the query based on annotation type in response to user interaction.

20. The method as recited in claim 17, further comprising:

storing the tessellated model in a file that excludes the CAD model.

21. The method as recited in claim 20, further comprising:

displaying the tessellated model in a lightweight viewer.

* * * * *